(12) United States Patent
Nii et al.

(10) Patent No.: US 10,450,405 B2
(45) Date of Patent: Oct. 22, 2019

(54) RESIN COMPOSITION, PREPREG, METAL FOIL WITH RESIN, METAL-CLAD LAMINATE, PRINTED WIRING BOARD

(71) Applicant: Panasonic Intellectual Property Management Co., Ltd., Osaka (JP)

(72) Inventors: Daisuke Nii, Fukushima (JP); Hidetsugu Motobe, Fukushima (JP); Toshiyuki Higashida, Fukushima (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 85 days.

(21) Appl. No.: 15/501,200

(22) PCT Filed: Aug. 25, 2015

(86) PCT No.: PCT/JP2015/004245
§ 371 (c)(1),
(2) Date: Feb. 2, 2017

(87) PCT Pub. No.: WO2016/031228
PCT Pub. Date: Mar. 3, 2016

(65) Prior Publication Data
US 2017/0226276 A1    Aug. 10, 2017

(30) Foreign Application Priority Data
Aug. 29, 2014   (JP) .................. 2014-175752

(51) Int. Cl.
*C08G 59/42* (2006.01)
*C08J 5/24* (2006.01)
(Continued)

(52) U.S. Cl.
CPC ......... *C08G 59/4284* (2013.01); *C08G 59/42* (2013.01); *C08G 59/4238* (2013.01);
(Continued)

(58) Field of Classification Search
CPC ................................................. C08G 59/4284
See application file for complete search history.

(56) References Cited

U.S. PATENT DOCUMENTS

2004/0151882 A1* 8/2004 Tani ................. H05K 1/056
428/209

FOREIGN PATENT DOCUMENTS

| CN | 1494366 A | 5/2004 |
|----|-----------|--------|
| JP | 57-018722 | 1/1982 |

(Continued)

OTHER PUBLICATIONS

International Search Report of PCT application No. PCT/JP2015/004245 dated Nov. 17, 2015.
(Continued)

*Primary Examiner* — Ian A Rummel
(74) *Attorney, Agent, or Firm* — McDermott Will & Emery LLP

(57) ABSTRACT

A resin composition contains an epoxy resin, and a curing agent including a first acid anhydride and a second acid anhydride. An unsaturated bond concentration in the second acid anhydride is not higher than 0.7%. The unsaturated bond concentration is represented by following formula (1). The ratio of the number of acid anhydride equivalents of the first acid anhydride to the number of epoxy equivalents of the epoxy resin is between 0.05 and 0.5 (inclusive). The ratio of the total number of acid anhydride equivalents of the first acid anhydride and the second acid anhydride to the number of epoxy equivalents is between 0.5 and 1.1 (inclusive).

Unsaturated bond concentration={(number of unsaturated bonds per molecule)/(molecular weight)}/(number of acid anhydride groups per molecule)×100    (1)

8 Claims, 2 Drawing Sheets

(51) Int. Cl.
    *H05K 1/03*     (2006.01)
    *C08K 3/36*     (2006.01)

(52) U.S. Cl.
    CPC    *C08J 5/24* (2013.01); *C08K 3/36* (2013.01); *H05K 1/0326* (2013.01); *H05K 1/0373* (2013.01); *C08J 2363/00* (2013.01); *H05K 1/0366* (2013.01)

(56) References Cited

FOREIGN PATENT DOCUMENTS

| | | |
|---|---|---|
| JP | 60-032819 | 2/1985 |
| JP | 61-078842 | 4/1986 |
| JP | 9-194610 | 7/1997 |
| JP | 2005-105099 A | 4/2005 |
| JP | 2010-053334 | 3/2010 |

OTHER PUBLICATIONS

English Translation of Taiwan IPO Search Report dated Nov. 19, 2018 for the related Taiwan Invention Patent Application No. 104128144.

* cited by examiner

RESIN COMPOSITION, PREPREG, METAL FOIL WITH RESIN, METAL-CLAD LAMINATE, PRINTED WIRING BOARD

TECHNICAL FIELD

The present disclosure relates to a resin composition, a prepreg, and a metal-clad laminated board, which are to be used as materials for a printed wiring board, and a printed wiring board fabricated from these materials.

BACKGROUND

Conventionally, research has been conducted to enhance heat resistance of printed wiring boards used in electronic devices, by improving, for example, glass transition temperature (Tg). Research also has been conducted to enhance flame retardancy of these boards. As a recent trend, compact electronic devices such as mobile devices have been made smaller and thinner with more functions. Along with this trend, there is an increasing demand in the market for printed wiring boards that have a lower dielectric constant and a lower CTE (coefficient of thermal expansion). As an insulating material for printed wiring boards, an epoxy resin composition is commonly used. The epoxy resin composition contains a phenol-based curing agent, a diamine-based curing agent, a cyanate-based curing agent, or an acid-anhydride-based curing agent, for example, as a curing agent for epoxy resin. Among these various curing agents, the acid-anhydride-based curing agent is known to be particularly effective in lowering dielectric constant. Examples of conventional acid-anhydride-based curing agents include polyfunctional acid anhydride compounds that contain a plurality of cyclic acid anhydrides per molecule and styrene-(maleic acid) (SMA) copolymers. In Unexamined Japanese Patent Publication No. 9-194610, for example, a copolymer essentially composed of styrene and maleic anhydride (SMA) is used as the acid-anhydride-based curing agent.

SUMMARY

The present disclosure provides a resin composition that can achieve a high glass transition temperature and a low dielectric constant, a prepreg, a metal-clad laminated board, and a printed wiring board.

The resin composition according to the present disclosure includes an epoxy resin and a curing agent. The curing agent includes a first acid anhydride and a second acid anhydride, the first acid anhydride having one cyclic acid anhydride group, the second acid anhydride having a plurality of acid anhydride groups. An unsaturated bond concentration in the second acid anhydride is not higher than 0.7%. The unsaturated bond concentration is represented by following formula (1). The ratio of the number of acid anhydride equivalents of the first acid anhydride to the number of epoxy equivalents of the epoxy resin is between 0.05 and 0.5 (inclusive). The ratio of the total number of acid anhydride equivalents of the first acid anhydride and the second acid anhydride to the number of epoxy equivalents is between 0.5 and 1.1 (inclusive).

$$\text{Unsaturated bond concentration} = \{(\text{number of unsaturated carbon-carbon bonds per molecule})/(\text{molecular weight})\}/(\text{number of acid anhydride groups per molecule}) \times 100 \quad (1)$$

In the present disclosure, the first acid anhydride and the second acid anhydride in a certain proportion are used in combination as a curing agent. This combination can achieve a high glass transition temperature and a low dielectric constant.

DESCRIPTION OF EMBODIMENT

Figure 1:
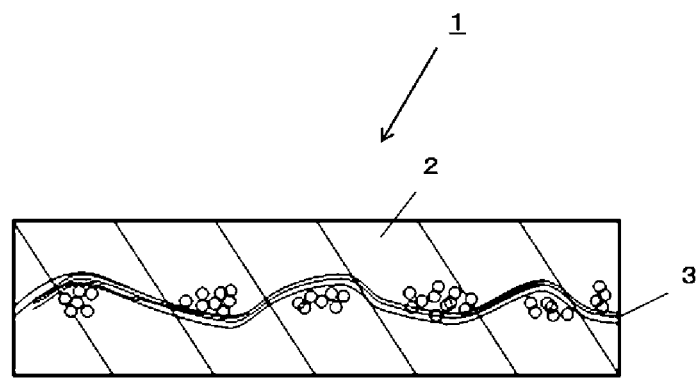
FIG. 1 is a sectional view of a prepreg according to an exemplary embodiment of the present disclosure.

Before describing an exemplary embodiment of the present disclosure, problems of conventional printed wiring boards fabricated by using an epoxy resin are described.

Such conventional printed wiring boards are fabricated by using an epoxy resin and contain, as a curing agent for curing the epoxy resin, a compound that is based on the second acid anhydride. These printed wiring boards do not fully satisfy the requirements of the market in terms of a low dielectric constant, and leave it difficult to achieve a high glass transition temperature.

To solve these problems, the inventors of the present disclosure have conducted intensive research. The inventors have first focused on a monofunctional acid anhydride as a candidate curing agent for achieving a low dielectric constant. As a result, the inventors have found that when the first acid anhydride is used as a curing agent for curing the epoxy resin, a high glass transition temperature and a low dielectric constant are both achieved. However, because the first acid anhydride has a relatively low molecular weight and is therefore volatile, part of the first acid anhydride can volatilize and be lost during the process of impregnating a base material with the resin composition and drying for prepreg production. When the first acid anhydride thus partly volatilizes, the composition ratio in the resin composition can greatly change before and after prepreg production. This change in the composition ratio may adversely influence the properties of the resulting printed wiring board. The inventors of the present disclosure have further studied and, as a result, have completed the present disclosure.

The present exemplary embodiment will be described below.

A resin composition according to the present exemplary embodiment includes an epoxy resin and a curing agent.

The epoxy resin is not particularly limited provided that it contains two or more epoxy groups. Examples of the epoxy resin include dicyclopentadiene epoxy resins, phosphorus-containing epoxy resins, naphthalene epoxy resins, bisphenol A epoxy resins, bisphenol F epoxy resins, phenol novolac epoxy resins, cresol novolac epoxy resins, bisphenol A novolac epoxy resins, biphenyl epoxy resins, alicyclic epoxy resins, compounds of a polyfunctional phenol and diglycidyl ether, and compounds of a polyfunctional alcohol and diglycidyl ether. These epoxy resins can be used alone or as a combination of two or more of these. Among these, phosphorus-containing epoxy resins can increase the phosphorus content in the resulting resin composition and therefore can improve flame retardancy.

The resin composition according to the present exemplary embodiment includes, as a curing agent, a first acid anhydride and a second acid anhydride.

Next, the first acid anhydride is described. The first acid anhydride is an acid anhydride having one cyclic acid anhydride group (—COOCO—) per molecule. Examples of the first acid anhydride include acid anhydrides such as acid anhydrides of dicarboxylic acid compounds and acid anhydrides of tricarboxylic acid compounds. Specific examples of the dicarboxylic anhydrides include maleic anhydride, phthalic anhydride, 4-methylhexahydrophthalic anhydride, hexahydrophthalic anhydride, methylbicyclo[2.2.1]heptane-2,3-dicarboxylic anhydride, bicyclo[2.2.1]heptane-2,3-dicarboxylic anhydride, and 1,2,3,6-tetrahydrophthalic anhydride. Specific examples of the tricarboxylic anhydrides include trimellitic anhydride. Among these acid anhydrides, alicyclic anhydrides such as 4-methylhexahydrophthalic anhydride, hexahydrophthalic anhydride, methylbicyclo[2.2.1]heptane-2,3-dicarboxylic anhydride, bicyclo[2.2.1]heptane-2,3-dicarboxylic anhydride, and 1,2,3,6-tetrahydrophthalic anhydride are suitable for achieving a low dielectric constant. In the present exemplary embodiment, the first acid anhydride is preferably subjected to preliminary reaction, which is to be described below. This preliminary reaction is particularly effective when the boiling point of the first acid anhydride is not higher than 150° C. and preferably not higher than 130° C. and volatilization of the first acid anhydride is suppressed effectively. The molecular weight of the first acid anhydride used as a curing agent is lower than the molecular weight of SMA or the like. This lower molecular weight is effective in suppressing an increase in the viscosity of varnish. The weight average molecular weight of the first acid anhydride is preferably not higher than 400, for example. Combined use of the first acid anhydride having such a weight average molecular weight with the second acid anhydride can achieve a low dielectric constant (relative dielectric constant (Dk)) of the resulting cured product and can achieve a high glass transition temperature of the resulting cured product. The first acid anhydride can be used alone or as a combination of two or more of these.

Next, the second acid anhydride is described. The second acid anhydride is an acid anhydride having, as functional groups, a plurality of acid anhydride groups such as cyclic acid anhydrides. An unsaturated bond concentration in the second acid anhydride represented by following formula (1) is not higher than 0.7%. Specific examples of the second acid anhydride that satisfies this concentration requirement include hydrogenated cyclohexane-1,2,4,5-tetracarboxylic dianhydride (H-PMDA) and 5-(2,5-dioxotetrahydro-3-furanyl)-3-methyl-3-cyclohexene-1,2-dicarboxylic anhydride (MCTC). The second acid anhydride can be used alone or as a combination of two or more of these. When the unsaturated bond concentration of carbon-carbon bond in the second acid anhydride is higher than 0.7%, it may be difficult to obtain a low dielectric constant and a high glass transition temperature together.

Unsaturated bond concentration={(number of unsaturated carbon-carbon bonds per molecule)/(molecular weight)}/(number of acid anhydride groups per molecule)×100   (1)

The second acid anhydride is particularly preferably at least one kind selected from pyromellitic anhydride (PMDA), hydrogenated cyclohexane-1,2,4,5-tetracarboxylic dianhydride (H-PMDA), and 5-(2,5-dioxotetrahydro-3-furanyl)-3-methyl-3-cyclohexene-1,2-dicarboxylic anhydride (MCTC). In such cases, a low dielectric constant and a high glass transition temperature are readily obtained together.

In the present exemplary embodiment, the ratio of the number of acid anhydride equivalents of the first acid anhydride to the number of epoxy equivalents of the epoxy resin is between 0.05 and 0.5 (inclusive). In addition, the ratio of the total number of acid anhydride equivalents of the first acid anhydride and the second acid anhydride to the number of epoxy equivalents is between 0.5 and 1.1 (inclusive). When these ratio requirements are not satisfied, it may be difficult to obtain a low dielectric constant and a high glass transition temperature together. The number of epoxy equivalents is the ratio of the amount (g) of the epoxy resin in the resin composition to the epoxy equivalent weight (g/eq) of the epoxy resin. The epoxy equivalent weight is the ratio of the molecular weight of the epoxy resin to the number of epoxy groups in the epoxy resin molecule. The number of acid anhydride equivalents is the ratio of the amount of acid anhydride (g) in the resin composition to the acid anhydride equivalent weight (g/eq) of the acid anhydride. The acid anhydride equivalent weight is the ratio of the molecular weight of the acid anhydride to the number of acid anhydride groups in the acid anhydride molecule. When the molecular weight of the epoxy resin is Ma and the epoxy resin molecule has 2 epoxy groups, the epoxy equivalent weight of the epoxy resin is Ma/2. In this case, when the amount of the epoxy resin is Ca, the number of epoxy equivalents of the epoxy resin is 2 Ca/Ma. Examples of the acid anhydride groups referred to herein in calculation of the number of acid anhydride equivalents include cyclic acid anhydride groups and non-cyclic acid anhydride groups.

It is preferable that in the resin composition according to the present exemplary embodiment, the epoxy resin and part or all of the first acid anhydride are contained in a form of a preliminary reaction product that is obtained by subjecting the epoxy resin and part or all of the first acid anhydride to reaction in advance. The preliminary reaction product obtained by the preliminary reaction can contain an ester bond within the molecule. It is considered that this ester bond is formed by reaction between an epoxy group and an acid anhydride group.

The epoxy resin and the first acid anhydride are contained in the preliminary reaction product so that the ratio between the number of epoxy equivalents of the epoxy resin and the number of acid anhydride equivalents of the first acid anhydride is between 0.05 and 0.5 (inclusive) (1:0.05 to 1:0.5). When the ratio between the number of epoxy equivalents and the number of acid anhydride equivalents is lower than 0.05, the glass transition temperature may not be high or the dielectric constant may not be low enough. When the ratio between the number of epoxy equivalents and the number of acid anhydride equivalents is higher than 0.5, the reaction rate of the first acid anhydride in the preliminary reaction is high. Such a high reaction rate facilitates formation of a three-dimensional network during the reaction, yielding a gelled resin composition. If the resin composition is gelled, a base material is less likely to be impregnated with it. In this case, prepreg production may be difficult.

It is preferable that the reaction between the epoxy resin and the first acid anhydride in the preliminary reaction product has proceeded enough to achieve a proportion of open rings in the first acid anhydride of not lower than 80% (upper limit, 100%).

The proportion of open rings in the first acid anhydride can be calculated by the following method, for example. First, at least the epoxy resin and the first acid anhydride to be subjected to the preliminary reaction are mixed together and dissolved in a solvent, and a varnish (a primary varnish to be described below) is prepared. A curing accelerator may also be added to the varnish provided that no other organic component reactive with the epoxy resin is added. Examples of the other organic component include the second acid anhydride and a reactive flame retardant. The resulting varnish is subjected to measurement before and after heating, and an infrared absorption spectrum is obtained. The resulting spectrum has a peak near a range from 1800 $cm^{-1}$ to 1900 $cm^{-1}$ attributed to a cyclic acid anhydride group. The peak area before heating ($A_1$) and the peak area after heating ($A_2$) are determined. Heating of the varnish is conducted under the following conditions: between 60° C. and 80° C. (inclusive) for a duration between 1 hour and 5 hours (inclusive). The spectrum also has a peak near a range from 1500 $cm^{-1}$ to 1530 $cm^{-1}$ attributed to the internal standard benzene ring. The peak area before heating ($B_1$) and the peak area after heating ($B_2$) are determined. The resulting values of peak area are substituted into the following formula and, as a result, the proportion of open rings in the first acid anhydride can be obtained.

Proportion of open rings in first acid anhydride
  (%)={1−($A_2$/$B_2$)/($A_1$/$B_1$)}×100

When the proportion of open rings in the first acid anhydride is lower than 80%, much of the first acid anhydride remains unreacted and the remaining first acid anhydride is likely to volatilize and be lost during prepreg production. If the first acid anhydride thus volatilizes, not a sufficient amount of the curing agent may be left and, as a result, the cured product of the resin composition may have a low crosslink density. In this case, the cured product may have a low glass transition temperature and a low heat resistance. The proportion of open rings in the first acid anhydride changes depending on the heating temperature and the heating time during varnish preparation. Therefore, the heating conditions are to be appropriately controlled so that the proportion of open rings does not become lower than 80%. Controlling the conditions of the preliminary reaction can be suitably achieved by taking a sample of the reaction product with time during the preliminary reaction and checking the proportion of open rings.

As described above, the resin composition preferably includes the second acid anhydride and the preliminary reaction product that is obtained by subjecting the epoxy resin and the first acid anhydride to reaction in advance. The preliminary reaction product contains an unreacted epoxy group because the ratio between the number of epoxy equivalents of the epoxy resin and the number of acid anhydride equivalents of the first acid anhydride is between 0.05 and 0.5 (inclusive). All of the first acid anhydride may be subjected to reaction, or a minimal amount of the first acid anhydride may remain unreacted in the preliminary reaction product. The resin composition can contain unreacted second acid anhydride because the ratio of the number of acid anhydride equivalents of the first acid anhydride and the number of acid anhydride equivalents of the second acid anhydride in total to the number of epoxy equivalents of the epoxy resin is between 0.5 and 1.1 (1:0.5 to 1:1.1) (inclusive).

The resin composition may further include a flame retardant and a curing accelerator, for example.

Examples of the flame retardant may include a halogen-based flame retardant and a non-halogen-based flame retardant. Examples of the non-halogen-based flame retardant may include a phosphorus-containing flame retardant. When the phosphorus-containing flame retardant is used, the total phosphorus content in the organic component of the resin composition and in the phosphorus-containing flame retardant is preferably not lower than 1.0% by mass for excellent flame retardancy. The upper limit to the total phosphorus content is not particularly limited. However, when the content of the phosphorus-containing flame retardant is higher than what is necessary and sufficient for achieving flame retardancy, electrical properties and heat resistance, among others, may be low. For this reason, the total phosphorus content in the organic component and in the phosphorus-containing flame retardant is preferably not higher than 5.0% by mass, for example. Besides, at least part of the phosphorus-containing flame retardant is preferably a reactive phosphorus-containing flame retardant that contains a functional group reactive with an acid anhydride group or a carboxy group (—COOH). The acid anhydride group herein is, for example, an acid anhydride group in unreacted first acid anhydride and unreacted second acid anhydride, and the carboxy group herein is, for example, a carboxy group formed upon ring opening of an acid anhydride group in the first acid anhydride or in the second acid anhydride during reaction of the epoxy resin with the first acid anhydride and the second acid anhydride. Specific examples of the functional group in the reactive phosphorus-containing flame retardant include hydroxy group and amino group. The first acid anhydride and the second acid anhydride have many oxygen atoms and therefore tend to impair flame retardancy of the cured product. However, after the first acid anhydride and the second acid anhydride are subjected to reaction with the reactive phosphorus-containing flame retardant, the oxygen atoms in the first acid anhydride and in the second acid anhydride have phosphorus atoms present near them, resulting in a potential improvement in the flame retardancy. The flame retardant can be used alone or as a combination of two or more of these. Provided that the effects of the present disclosure are not impaired, the phosphorus-containing flame retardant may be a fused-type phosphorus-containing flame retardant or a dispersed-type phosphorus-containing flame retardant neither of which reacts with the first acid anhydride nor the second acid anhydride, or may be a flame retardant containing no phosphorus. The fused-type phosphorus-containing flame retardant is to be fused with the resin composition and gives a homogeneous system. Specific examples of the fused-type phosphorus-containing flame retardant include phosphazenes. The dispersed-type phosphorus-containing flame retardant is not to be fused with the resin composition but is dispersed in the resin composition, and gives a heterogeneous system. Specific examples of the dispersed-type phosphorus-containing flame retardant include aluminum phosphinate, which is a metal phosphate.

The curing accelerator is not particularly limited provided that it can facilitate reaction between the epoxy resin and the curing agent. For example, an imidazole-based compound such as 2-ethyl-4-methylimidazole (2E4MZ) can be used. The content of the curing accelerator is not particularly limited provided that the effects of the present disclosure are not impaired.

The resin composition may further include an inorganic filler, for example. Examples of the inorganic filler include silicas such as spherical silica and crushed silica as well as metal hydroxides such as aluminum hydroxide and magnesium hydroxide. The content of the inorganic filler can be appropriately determined in consideration of, among others, the balance between the effect of lowering the dielectric constant and the effect of increasing Tg. As long as a good balance is achieved, the content of the inorganic filler is not particularly limited.

Particularly preferably, the content of the inorganic filler is between 5 parts by mass and 50 parts by mass (inclusive) relative to an amount of the resin composition excluding the inorganic filler, the amount being 100 parts by mass. When the content of the inorganic filler is not lower than 5 parts by mass, an increase in CTE is suppressed. When the content of the inorganic filler is not higher than 50 parts by mass, a decrease in the fluidity of the resin composition is suppressed.

The inorganic filler is preferably subjected to preliminary surface treatment with the use of a silane coupling agent. Examples of the silane coupling agent include epoxysilane, isocyanate silane, aminosilane, vinylsilane, methacrylsilane, acrylsilane, ureidosilane, mercaptosilane, sulfide silane, and styrylsilane. When the silane coupling agent is used, it can be used alone or as a combination of two or more of these. Usually, the reaction between the epoxy resin and an acid-anhydride-based curing agent produces only a small number of polar groups. Even when the number of polar groups is small, use of such a surface-treated inorganic filler can improve the alkaline resistance of the cured product of the resin composition because the silane coupling agent can bind the inorganic filler and the organic component tightly.

Examples of the method for surface treatment include the direct treatment method and the integral blending method. In the direct treatment method, the inorganic filler is directly treated with the silane coupling agent in advance and then the resulting, surface-treated inorganic filler is added to a base varnish to be described below. In the integral blending method, the silane coupling agent is added to a base varnish to which the inorganic filler is already added. Compared to the integral blending method, the direct treatment method can more efficiently bind the inorganic filler and the organic component and can therefore achieve further improvement in the alkaline resistance of the cured product of the resin composition. Therefore, the direct treatment method is preferable.

When the integral blending method is employed, in particular, the content of the silane coupling agent in the resin composition is preferably between 1 part by mass and 10 parts by mass (inclusive) relative to the amount of the inorganic filler, the amount being 100 parts by mass. When the content of the silane coupling agent is not lower than 1 part by mass, alkaline resistance of the cured product of the resin composition can be further improved. When the content of the silane coupling agent is not higher than 10 parts by mass, a decrease in heat resistance can be suppressed.

Subsequently, the resin composition can be prepared as the base varnish and then as a resin varnish by the following method. The base varnish is a varnish containing the organic component but not containing an inorganic component such as the inorganic filler.

First, the method for preparing the base varnish by the preliminary reaction between the first acid anhydride and the epoxy resin is described. At least the epoxy resin and the first acid anhydride to be subjected to the preliminary reaction are mixed together and dissolved in a solvent, and a varnish (a primary varnish) is prepared. To the primary varnish, an organic component that does not directly react with the epoxy resin or with the first acid anhydride can also be added, such as the curing accelerator and a non-reactive flame retardant. An organic component reactive with the epoxy resin or with the first acid anhydride is not added to the primary varnish but added to the system after the preliminary reaction. Examples of the reactive organic component include the second acid anhydride and a reactive flame retardant. Such a component to be added after the preliminary reaction is called an added-later component. During dissolution in the solvent, the solid content (the content of non-solvent component) in the primary varnish is between 60% by mass and 80% by mass (inclusive). The resulting solution is heated at a temperature between 60° C. and 80° C. (inclusive) for a duration between 1 hour and 5 hours (inclusive) with stirring with a stirrer, such as a disperser, so that the preliminary reaction proceeds. By the preliminary reaction, the preliminary reaction product is obtained in the primary varnish. The preliminary reaction product is produced by reaction between the epoxy resin and the first acid anhydride. The correlation between the conditions of the preliminary reaction, including the heating temperature and the reaction time, and the proportion of open rings in the first acid anhydride should be understood in advance by experiments, such as by taking samples as described above. By referring to the correlation to control the conditions of the preliminary reaction, the proportion of open rings in the first acid anhydride in the reaction product can be made not lower than 80%. The heating temperature and the heating time described above are merely illustrative. Examples of the solvent used in varnish preparation include solvents that do not react with the epoxy resin or with the first acid anhydride, including ethers such as ethylene glycol monomethyl ether, ketones such as acetone and methyl ethyl ketone (MEK), and aromatic hydrocarbons such as benzene and toluene. It is desirable to avoid using a solvent that has a hydroxy group, such as an alcoholic solvent, because such a solvent is reactive with an acid anhydride. Subsequently, the added-later component is added to and mixed with the primary varnish. Thus, the base varnish can be prepared. During mixing, the primary varnish may be supplied with an additional amount of the solvent, as needed.

Next, the method for preparing the base varnish without conducting the preliminary reaction between the first acid anhydride and the epoxy resin is described. In this method, the base varnish can be prepared by mixing at least the epoxy resin, the first acid anhydride, and the second acid anhydride together and dissolving them in a solvent. During this process, components other than the inorganic filler, namely, components such as the curing accelerator and the flame retardant can also be added thereto. The solid content (the content of non-solvent component) in the base varnish is between 60% by mass and 80% by mass (inclusive). The base varnish is then homogeneously mixed at a temperature between 20° C. and 40° C. (inclusive) for a duration between 1 hour and 3 hours (inclusive) with stirring with a stirrer such as a disperser. This method for base varnish preparation is merely illustrative. The solvent used in this method can be the same as the solvent described above.

When no inorganic component such as the inorganic filler is used, the base varnish after stirring and mixing can be used as it is as a resin varnish in prepreg production, regardless of whether the preliminary reaction is conducted. When an inorganic component is used, on the other hand, the resin varnish can be prepared by adding the inorganic component to the base varnish and homogeneously mixing the resultant with stirring at a temperature between 20° C. and 40° C. (inclusive) for a duration between 1 hour and 3 hours (inclusive), regardless of whether the preliminary reaction is conducted. The inorganic component is the inorganic filler, for example. When the inorganic filler is used, the direct treatment method may be employed in which the surface-treated inorganic filler is added to the base varnish or, alternatively, the integral blending method may be employed in which the inorganic filler and the silane coupling agent are directly added to the base varnish.

FIG. 1 is a sectional view of a prepreg 1 according to the present exemplary embodiment.

Prepreg 1 includes resin composition 2 in an uncured state and base material 3, base material 3 being impregnated with resin composition 2. As resin composition 2, the resin composition described above is used.

In the present exemplary embodiment, a base material such as glass cloth is impregnated with the resin varnish of resin composition 2 obtained above. The resulting base material 3 thus impregnated with the resin varnish is heated at a temperature between 110° C. and 140° C. (inclusive) for drying. During drying, the solvent is removed from the resin varnish and resin composition 2 is half-cured. Thus, prepreg 1 can be produced. Preferably, most of the first acid anhydride is present in a form of the preliminary reaction product due to the preliminary reaction with the epoxy resin. In this case, the first acid anhydride is less likely to volatilize in the process of heating and drying and therefore most of the first acid anhydride remains in resin composition 2 that is in a form of a half-cured prepreg. The conditions during heating and drying may be appropriately controlled so as to achieve the desired gelling time of prepreg 1. For example, the conditions during heating and drying are preferably controlled so as to achieve a gelling time between 60 seconds and 240 seconds (inclusive). The gelling time for prepreg 1 is the time required for gelling of a portion of the half-cured resin composition extracted from the prepreg, measured from right after placement of the portion on a plate heated to 170° C. until gelling. Regarding the resin content in prepreg 1, the content of the resin composition is preferably between 30 parts by mass and 80 parts by mass (inclusive) (between 30% by mass and 80% by mass (inclusive)) relative to the amount of the prepreg, the amount being 100 parts by mass. The resin content in prepreg 1 is the content of the resin composition in prepreg 1.

Figure 2:
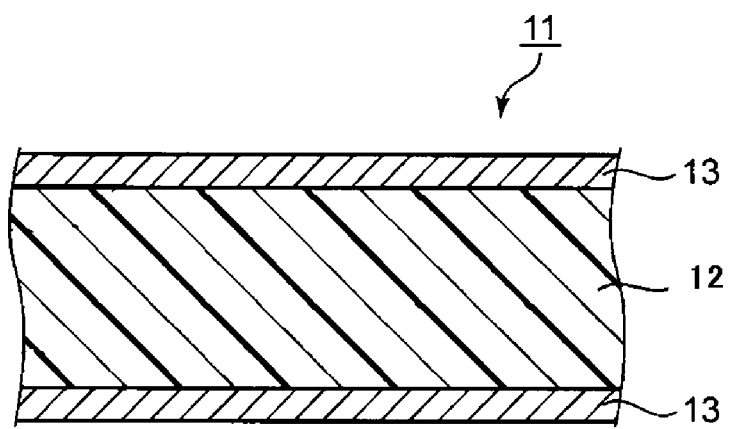
FIG. 2 is a sectional view of a metal-clad laminated board according to the present exemplary embodiment.

FIG. 2 is a sectional view of metal-clad laminated board 11 according to the present exemplary embodiment.

Metal-clad laminated board 11 includes insulating layer 12 containing the cured product of resin composition 2 and metal layer 13 bonded to insulating layer 12.

In the present exemplary embodiment, metal-clad laminated board 11 can be produced by laminating prepreg 1 produced as described above and metal layer 13 together and subjecting the resulting laminate to heating and pressurization. For example, a plurality of prepregs 1 are laminated together and the resulting laminate is used as a prepreg. Metal layer 13 is a piece of copper foil, for example, and covers either plane of the laminate thus made of prepregs 1, the plane being either end of the laminate in the laminating direction. In metal-clad laminated board 11, the cured product of prepreg 1 constitutes insulating layer 12. Prepreg 1 and metal layer 13 are heated and pressurized under conditions of, for example, a temperature between 140° C. and 200° C. (inclusive) and a pressure between 0.5 MPa and 5.0 MPa (inclusive) for a duration between 40 minutes and 240 minutes (inclusive). Being composed of the cured product of resin composition 2, the cured resin layer that constitutes insulating layer 12 can have a high glass transition temperature and therefore can have an improved heat resistance. In addition, insulating layer 12 can have a low dielectric constant because the first acid anhydride and the second acid anhydride are used in combination.

Alternatively, metal-clad laminated board 11 according to the present exemplary embodiment can be produced without using prepreg 1. For example, the resin composition varnish described above is applied directly to the surface of metal layer 13, followed by heating and pressurizing metal layer 13 and the resin composition, and thus insulating layer 12 is obtained with the use of the resin composition varnish. The conditions during heating and pressurization are the same as those in the method for producing insulating layer 12 from prepreg 1. Subsequently by the method described above, metal-clad laminated board 11 is produced.

Figure 3:
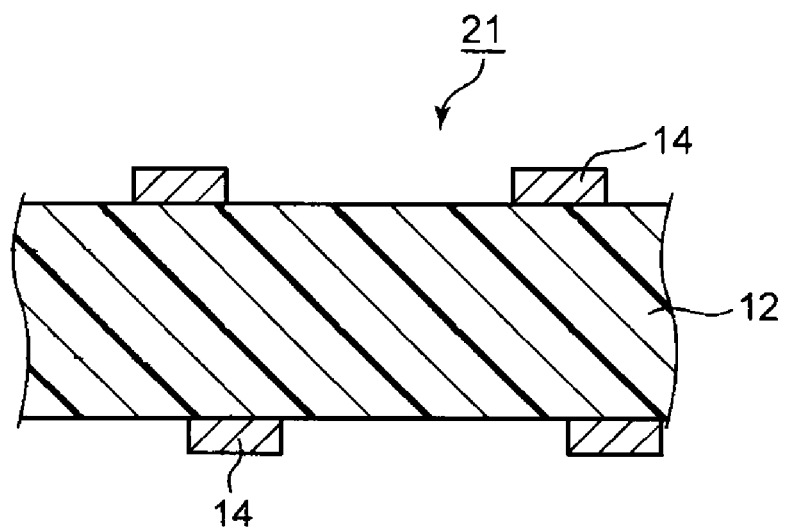
FIG. 3 is a sectional view of a printed wiring board according to the present exemplary embodiment.

FIG. 3 is a sectional view of printed wiring board 21 according to the present exemplary embodiment.

Printed wiring board 21 includes insulating layer 12 containing the cured product of resin composition 2 and wiring 14 bonded to insulating layer 12.

Printed wiring board 21 can be produced by forming wiring 14 as a pattern on metal-clad laminated board 11. As a way of example, printed wiring board 21 includes insulating layer 12 composed of the cured product of the prepreg. Printed wiring board 21 can be produced by, for example, the subtractive method in which a wiring pattern is formed on the surface of metal-clad laminated board 11.

By using this printed wiring board 21 as a core material (an inner layer material), a multilayered printed wiring board can be produced. When the multilayered printed wiring board (not shown in the figure) is produced, the conductive pattern (the inner layer pattern) on the core material is subjected to surface treatment with black oxide or the like to make the surface of the conductive pattern rough. The resulting surface of the core material is covered with a metal layer, with the prepreg interposed between them. The core material covered with the metal foil is heated and pressurized into a laminate. The heating and pressurization are conducted under, for example, the same conditions as above, namely, a temperature between 140° C. and 200° C. (inclusive) and a pressure between 0.5 MPa and 5.0 MPa (inclusive) for a duration between 40 minutes and 240 minutes (inclusive). Then, perforation by drilling as well as desmear treatment are conducted. The resulting workpiece is then subjected to the subtractive method for forming the metal layer into a wiring pattern (an outer layer pattern) as well as to plating treatment for plating the interior wall of the holes so as to make them into through holes. Thus, the multilayered printed wiring board is produced. The number of layers in the printed wiring board is not particularly limited.

Printed wiring board 21 has a low dielectric constant in the insulating layer. As a result, the rate of signal transmission via the conductive pattern is high and therefore a large amount of information can be processed at a high speed.

Figure 4:
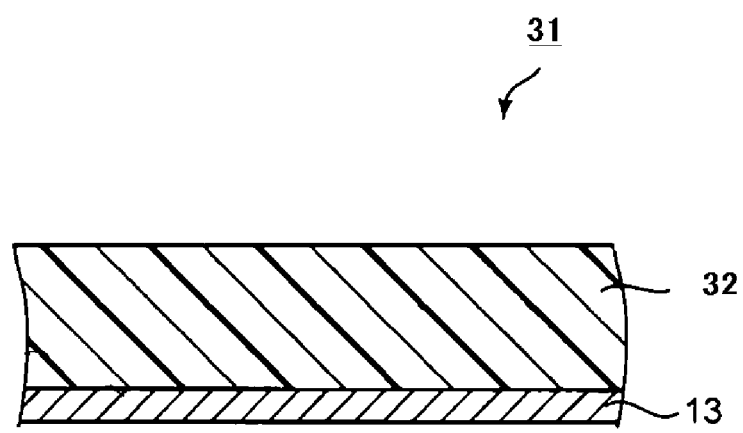
FIG. 4 is a sectional view of a metal foil with resin according to the present exemplary embodiment.

FIG. 4 is a sectional view of metal foil 31 with resin according to the present exemplary embodiment.

Metal foil 31 with resin includes insulating layer 12 containing resin composition 2 in an uncured state and metal 13 bonded to insulating layer 12.

When metal foil 31 with resin is used for fabrication of a printed wiring board, the resulting printed wiring board can have its signal transmission loss further lowered while the adhesion between the wiring and the insulating layer is maintained.

Metal foil 31 with resin is produced by, for example, applying resin composition 2 in a form of varnish to metal layer 13 and then heating. Application of the thermosetting resin composition varnish to metal layer 13 is conducted with a bar coater, for example. Resin composition 2 thus applied is heated under conditions of, for example, a temperature between 80° C. and 180° C. (inclusive) for a duration between 1 minute and 10 minutes (inclusive). Resin composition 2 thus heated constitutes an uncured insulating layer 32 on the bonding surface of metal layer 13.

Printed wiring board 21 can be fabricated not only by the method described above using metal-clad laminated board 11 but also by a method using metal foil 31 with resin. Examples of the method for fabrication of the printed wiring board using metal foil 31 with resin include a method of covering a resin substrate having wiring formed thereon with metal foil 31 with resin and a method of laminating a plurality of metal foil with resins together. In either method, the uncured insulating layer 32 is cured by heating. Then, metal layer 13 is partly removed so as to form wiring (not shown in the figure) from metal layer 13.

EXAMPLES

The effects of the present disclosure are specifically described below by examples.
(Epoxy Resin)
As the epoxy resin, a dicyclopentadiene epoxy resin is used. Specifically, "HP-7200H" manufactured by DIC Corporation is used. The epoxy equivalent weight is 282 g/eq, and the softening point is between 100° C. and 105° C. (inclusive).
(Curing Agent)
As the first acid anhydride, a liquid alicyclic anhydride is used. Specifically, "RIKACID MH-700" manufactured by New Japan Chemical Co., Ltd. is used. The ratio between 4-methylhexahydrophthalic anhydride and hexahydrophthalic anhydride is 70/30. The acid anhydride equivalent weight is between 161 g/eq and 166 g/eq (inclusive). The neutralization number is 670 KOHmg/g. The coagulation point is 20° C.

As the second acid anhydride, pyromellitic anhydride (PMDA), hydrogenated cyclohexane-1,2,4,5-tetracarboxylic dianhydride (H-PMDA), 3,3',4,4'-biphenyltetracarboxylic dianhydride (BPDA), 5-(2,5-dioxotetrahydro-3-furanyl)-3-methyl-3-cyclohexene-1,2-dicarboxylic anhydride (MCTC), 2,2-bis[4-(3,4-dicarboxyphenoxy)phenyl]propanoic dianhydride (BPADA), or ethylene glycol bisanhydrotrimellitate is used.

PMDA is manufactured by Daicel Chemical Industries, Ltd., with a number of unsaturated bonds of 3, a molecular weight of 218, a number of acid anhydride groups of 2, and an unsaturated bond concentration of 0.69%.

H-PMDA is manufactured by Sunlight Pharmaceutical Co., Ltd., with a number of unsaturated bonds of 0, a molecular weight of 224, a number of acid anhydride groups of 2, and an unsaturated bond concentration of 0%.

BPDA is manufactured by Mitsubishi Chemical Corporation, with a number of unsaturated bonds of 6, a molecular weight of 294, a number of acid anhydride groups of 2, and an unsaturated bond concentration of 1.02%.

MCTC is manufactured by DIC Corporation, with a number of unsaturated bonds of 1, a molecular weight of 264, a number of acid anhydride groups of 2, and an unsaturated bond concentration of 0.19%.

BPADA is manufactured by Shanghai Research Institute of synthetic resins, with a number of unsaturated bonds of 12, a molecular weight of 520, a number of acid anhydride groups of 2, and an unsaturated bond concentration of 1.15%.

Ethylene glycol bisanhydrotrimellitate is manufactured by New Japan Chemical Co., Ltd., with a number of unsaturated bonds of 6, a molecular weight of 410, a number of acid anhydride groups of 2, and an unsaturated bond concentration of 0.73%.

As an amine-based curing agent, dicyandiamide is used. Specifically, "Dicy" manufactured by Nippon Carbide Industries Co., Inc. is used.

(Curing Accelerator)
As the curing accelerator, 2-ethyl-4-methylimidazole (2E4MZ) is used.
(Inorganic Filler)
As the inorganic filler, crushed silica is used. Specifically, "MC3000" manufactured by Admatechs Company Limited is used.
(Resin Composition)
In Examples 1 to 5 and Comparative Examples 1, 2, and 9, the epoxy resin, the first acid anhydride, and the curing accelerator are each used in an amount (part(s) by mass) shown in Table 1. The resulting mixture is diluted with a solvent (MEK) so as to achieve a concentration of a solid content (a content of non-solvent component) of between 60% by mass and 80% by mass (inclusive). The resulting dilute solution is heated at a temperature between 60° C. and 80° C. (inclusive) with stirring with a disperser for a duration between 1 hour and 5 hours (inclusive). By this process, a primary varnish containing a preliminary reaction product resulting from reaction between the epoxy resin and part of the first acid anhydride is prepared. The primary varnish is subjected to measurement before and after heating, and an infrared absorption spectrum is obtained, which is then used to calculate the proportion of open rings in the acid anhydride. The proportion of open rings thus calculated was not lower than 80%. To the primary varnish, the second acid anhydride is added in an amount (part(s) by mass) shown in Table 1. The resulting mixture is homogeneously mixed with stirring and, as a result, a base varnish is prepared.

In Example 6 and Comparative Examples 3 to 8, the preliminary reaction is not conducted but the epoxy resin, the curing agent, and the curing accelerator are mixed together each in an amount (part(s) by mass) shown in Table 1. The resulting mixture is diluted with a solvent (MEK) so as to achieve a concentration of a solid content (a content of non-solvent component) of between 60% by mass and 80% by mass (inclusive). The resulting dilute solution is homogeneously mixed at a temperature between 20° C. and 40° C. (inclusive) with stirring with a disperser for a duration between 1 hour and 3 hours (inclusive). By this process, a base varnish is prepared.

To the resulting base varnish, the inorganic filler is added in an amount (part(s) by mass) shown in Table 1. The resulting mixture is homogeneously mixed at a temperature between 20° C. and 40° C. (inclusive) with stirring with a disperser for 2 hours and, as a result, a resin varnish of Examples 1 to 6 and Comparative Examples 1 to 8, respectively, is prepared. The resin varnish of Comparative Example 1 gelled and, therefore, it was impossible to produce a prepreg described below.
(Prepreg)
A piece of glass cloth as a base material is impregnated with the resin varnish of the resin composition. The resultant is heated and dried at a temperature between 110° C. and 140° C. (inclusive) with a non-contact heater. In this process, the solvent is removed from the resulting resin varnish and the resin composition is half-cured. Thus, a prepreg is produced. The glass cloth used above is "1037-AS890AW" manufactured by Asahi Kasei Corp., which weighs 23.5 g/m2. Regarding the resin content in the prepreg, the amount of the resin composition is 72 parts by mass (72% by mass) relative to the content of the prepreg, the amount being 100 parts by mass. Heating and drying the prepreg is conducted so as to achieve a gelling time of the prepreg between 140 seconds and 160 seconds (inclusive).

(Metal-Clad Laminated Board)

A metal-clad laminated board produced herein is a copper-clad laminated board. Sixteen prepregs (340 mm×510 mm) are laminated together and a prepreg laminate is obtained. Either plane of the resulting laminate is then covered with a piece of copper foil, the plane being either end of the laminate in the thickness direction. The resulting laminate thus covered with copper foil is heated and pressurized and, as a result, a metal-clad laminated board is produced. The copper foil used is "3EC-III" manufactured by MITSUI MINING & SMELTING CO., LTD., which has a thickness of 18 μm. The conditions during heating and pressurization are 180° C., 2.9 MPa, and 60 minutes.

(Glass Transition Temperature (Tg))

The glass transition temperature of the prepreg is measured with a viscoelasticity spectrometer "DMS6100" manufactured by Seiko Instruments Inc. Specifically, the flexural modulus is measured at a frequency of 10 Hz while the temperature is raised from room temperature to 280° C. at a rate of 5° C./minute, and the temperature at which the value tan α reaches its highest value is determined as the glass transition temperature.

(Relative Dielectric Constant (Dk))

The relative dielectric constant of the copper-clad laminated board is measured at 1 GHz with an "impedance/material analyzer 4291A" manufactured by Hewlett-Packard in conformance with IPC-TM-650 2.5.5.9.

TABLE 1

|  |  |  | Example 1 | Example 2 | Example 3 | Example 4 | Example 5 | Example 6 | Comparative Example 1 | Comparative Example 2 |
|---|---|---|---|---|---|---|---|---|---|---|
| Unsaturated bond concentration in second acid anhydride (%) | | | 0 | 0.69 | 0.19 | 0.19 | 0.19 | 0.19 | 0 | 0 |
| Preliminary reaction between epoxy resin and first acid anhydride | | | Yes | Yes | Yes | Yes | Yes | No | Yes | Yes |
| (Number of epoxy equivalents): (number of acid anhydride equivalents of first acid anhydride) | | | 1:0.20 | 1:0.20 | 1:0.20 | 1:0.46 | 1:0.11 | 1:0.46 | 1:0.62 | 1:0.28 |
| (Number of epoxy equivalents): (number of acid anhydride equivalents of first acid anhydride and second acid anhydride) | | | 1:1 | 1:1 | 1:1 | 1:1 | 1:0.53 | 1:1 | 1:1 | 1:1.39 |
| Epoxy resin | HP-7200H (DCPD-type epoxy resin) | | 69.8 | 70.1 | 67.0 | 65.7 | 79.4 | 65.9 | 66.1 | 62.4 |
| Curing agent | First acid anhydride | RIKACID MH-700 (MeHHPA & HHPA) | 8.1 | 8.0 | 7.9 | 17.6 | 5.1 | 17.6 | 23.9 | 10.0 |
| | Second acid anhydride | PMDA | | 21.9 | | | | | | |
| | | H-PMDA | 22.1 | | | | | | 10.0 | 27.6 |
| | | BPDA | | | | | | | | |
| | | MCTC | | | 25.1 | 16.7 | 15.5 | 16.5 | | |
| | | BPADA | | | | | | | | |
| | | TMEG | | | | | | | | |
| | Dicyandiamide | Dicy | | | | | | | | |
| Curing accelerator | 2E4MZ | | 0.03 | 0.03 | 0.03 | 0.03 | 0.03 | 0.03 | 0.03 | 0.03 |
| | Total | | 100.0 | 100.0 | 100.0 | 100.0 | 100.0 | 100.0 | 100.0 | 100.0 |
| Inorganic filler | Crushed silica | MC3000 | 35 | 35 | 35 | 35 | 35 | 35 | 35 | 35 |
| Glass transition temperature (° C.) | | | 158 | 161 | 156 | 159 | 151 | 150 | Preliminary reaction | 146 |
| Dk (material) | | | 3.53 | 3.63 | 3.51 | 3.50 | 358 | 3.57 | Gelation | 3.65 |
| Resin content in prepreg (%) | | | 72 | 72 | 72 | 72 | 72 | 72 | — | 72 |
| Copper foil (3EC-III) thickness (μm) | | | 18 | 18 | 18 | 18 | 18 | 18 | — | 18 |

|  | Comparative Example 3 | Comparative Example 4 | Comparative Example 5 | Comparative Example 6 | Comparative Example 7 | Comparative Example 8 | Comparative Example 9 |
|---|---|---|---|---|---|---|---|
| Unsaturated bond concentration in second acid anhydride (%) | 0 | 1.02 | 1.15 | 0.73 | — | | 1.15 |
| Preliminary reaction between epoxy resin and first acid anhydride | No | No | No | No | No | No | Yes |
| (Number of epoxy equivalents): (number of acid anhydride equivalents of first acid anhydride) | 1.0 | 1.0 | 1:0 | 1:0 | 1:1 | 1:0 | 1:02 |
| (Number of epoxy equivalents): (number of acid anhydride equivalents of first acid anhydride and second acid anhydride) | 1:0.39 | 1:1 | 1:1 | 1:1 | 1:1 | 1:0 | 11 |

TABLE 1-continued

| | | | | | | | | | |
|---|---|---|---|---|---|---|---|---|---|
| Epoxy resin | HP-7200H (DCPD type epoxy resin) | | 86.6 | 65.8 | 52.0 | 57.9 | 63.5 | 96.4 | 37.2 |
| Curing agent | First acid anhydride | RIKACID MH-700 (MeHHPA & HHPA) | | | | | 36.5 | | 4.3 |
| | Second acid anhydride | PMDA | | | | | | | |
| | | H-PMDA | 13.4 | | | | | | |
| | | BPDA | | 34.2 | | | | | |
| | | MCTC | | | | | | | |
| | | BPADA | | | 48.0 | | | | 55 |
| | | TMEG | | | | 42.1 | | | |
| | Dicyandiamide | Dicy | | | | | | 3.5 | 3.5 |
| Curing accelerator | | 2E4MZ | 0.03 | 0.03 | 0.03 | 0.03 | 0.03 | 0.09 | 0.03 |
| | Total | | 100.0 | 100.0 | 100.0 | 100.0 | 100.0 | 100.0 | 100.0 |
| Inorganic filler | Crushed silica | MC3000 | 35 | 35 | 35 | 35 | 35 | 35 | 35 |
| | Glass transition temperature (° C.) | | 142 | 148 | 143 | 144 | 128 | 157 | 147 |
| | Dk (material) | | 3.68 | 3.71 | 3.73 | 3.68 | 3.88 | 3.84 | 3.69 |
| | Resin content in prepreg (%) | | 72 | 72 | 72 | 72 | 72 | 72 | 72 |
| | Copper foil (3EC-III) thickness (μm) | | 18 | 18 | 18 | 18 | 18 | 18 | 18 |

As is evident from Table 1, the glass transition temperature is high and the dielectric constant is low in the examples compared to those in the comparative examples. It has been confirmed that these properties in the examples are in a good balance. The respective properties in a good balance refer to the following: the glass transition temperature, Tg, is not lower than 150° C. and the relative dielectric constant, Dk, is not higher than 3.63.

Comparative Example 1 is different from Examples 1 to 5 in that the ratio of the number of acid anhydride equivalents of the first acid anhydride to the number of epoxy equivalents of the epoxy resin is higher than 0.5. In Comparative Example 1, the varnish gelled and, therefore, it was impossible to produce a prepreg. This result indicates that the ratio of the number of acid anhydride equivalents of the first acid anhydride to the number of epoxy equivalents of the epoxy resin needs to be not higher than 0.5 in the present disclosure.

Comparative Example 2 is different from Examples 1 to 6 in that the ratio of the total number of acid anhydride equivalents of the first acid anhydride and the second acid anhydride to the number of epoxy equivalents of the epoxy resin is higher than 1.1. Compared to the glass transition temperature and the relative dielectric constant in Comparative Example 2, both of the glass transition temperature and the relative dielectric constant in Examples 1 to 6 are excellent. This result indicates that the ratio of the total number of acid anhydride equivalents of the first acid anhydride and the second acid anhydride to the number of epoxy equivalents of the epoxy resin needs to be not higher than 1.1 in the present disclosure.

Comparative Example 3 is different from Examples 1 to 6 in that the ratio of the number of acid anhydride equivalents of the first acid anhydride to the number of epoxy equivalents of the epoxy resin is lower than 0.05 and the ratio of the total number of acid anhydride equivalents of the first acid anhydride and the second acid anhydride to the number of epoxy equivalents of the epoxy resin is lower than 0.5. Compared to the glass transition temperature and the relative dielectric constant in Comparative Example 3, both of the glass transition temperature and the relative dielectric constant in Examples 1 to 6 are excellent. This result indicates that the ratio of the number of acid anhydride equivalents of the first acid anhydride to the number of epoxy equivalents of the epoxy resin needs to be not lower than 0.05 and the ratio of the total number of acid anhydride equivalents of the first acid anhydride and the second acid anhydride to the number of epoxy equivalents of the epoxy resin needs to be not lower than 0.5 in the present disclosure.

Comparative Examples 4 to 6 are different from Examples 1 to 6 in that the ratio of the number of acid anhydride equivalents of the first acid anhydride to the number of epoxy equivalents of the epoxy resin is not higher than 0.05 (specifically, the ratio is zero) and the unsaturated bond concentration in the second acid anhydride is higher than 0.7%. Compared to the glass transition temperature and the relative dielectric constant in Comparative Examples 4 to 6, both of the glass transition temperature and the relative dielectric constant in Examples 1 to 6 are excellent. This result indicates that the ratio of the number of acid anhydride equivalents of the first acid anhydride to the number of epoxy equivalents of the epoxy resin needs to be not lower than 0.05 and the unsaturated bond concentration in the second acid anhydride needs to be not higher than 0.7% in the present disclosure.

Comparative Example 7 is different from Examples 1 to 6 in that no second acid anhydride is contained. Compared to the glass transition temperature and the relative dielectric constant in Comparative Example 7, the glass transition temperature and the relative dielectric constant in Examples 1 to 6 are excellent. This result indicates that the second acid anhydride having an unsaturated bond concentration of not higher than 0.7% needs to be contained in the present disclosure.

Comparative Example 8 is different from Examples 1 to 6 in that dicyandiamide instead of the acid anhydride is used as a curing agent. Although the glass transition temperature is as excellent as those in Examples 1 to 6, the relative dielectric constant in Comparative Example 8 is high compared to those in Examples 1 to 6. This result indicates that the first acid anhydride and the second acid anhydride need to be used as a curing agent for improvement of the glass transition temperature and the relative dielectric constant in the present disclosure.

Comparative Example 9 is different from Examples 1 to 6 in that the unsaturated bond concentration in the second acid anhydride is higher than 0.7%. Compared to the glass transition temperature and the relative dielectric constant in Comparative Example 9, both of the glass transition temperature and the relative dielectric constant in Examples 1 to 6 are excellent. This result indicates that the unsaturated bond concentration in the second acid anhydride needs to be not higher than 0.7% in the present disclosure.

The invention claimed is:

1. A resin composition, comprising:
   a primary varnish including an epoxy resin, a preliminary reaction product of the epoxy resin and a first acid anhydride having one cyclic acid anhydride group and a solvent; and
   a second acid anhydride having a plurality of acid anhydride groups, the second acid anhydride being added to the primary varnish, wherein:
   an unsaturated bond concentration of carbon-carbon bond in the second acid anhydride is not higher than 0.7%, the unsaturated bond concentration being represented by following formula:

unsaturated bond concentration={(number of unsaturated carbon-carbon bonds per molecule)/(molecular weight)}/(number of acid anhydride groups per molecule)×100, a ratio of a number of acid anhydride equivalents of the first acid anhydride to a number of epoxy equivalents of the epoxy resin is between 0.05 and 0.5, inclusive, and a ratio of a total number of acid anhydride equivalents of the first acid anhydride and the second acid anhydride to the number of epoxy equivalents is between 0.5 and 1.1, inclusive.

2. The resin composition according to claim 1, wherein the second acid anhydride is at least one kind selected from pyromellitic anhydride (PMDA), hydrogenated cyclohexane-1,2,4,5-tetracarboxylic dianhydride (H-PMDA), and 5-(2,5-dioxotetrahydro-3-furanyl)-3-methyl-3-cyclohexene-1,2-dicarboxylic anhydride (MCTC).

3. The resin composition according to claim 1, wherein a proportion of open rings in the first acid anhydride that has been reacted with the epoxy resin is not lower than 80%.

4. The resin composition according to claim 1, further comprising an inorganic filler, wherein
   a content of the inorganic filler is between 5 parts by mass and 50 parts by mass (inclusive) relative to an amount of the resin composition excluding the inorganic filler, the amount being 100 parts by mass.

5. A prepreg, comprising:
   a half-cured product of the resin composition according to claim 1; and
   a base material impregnated with the resin composition.

6. A metal-clad laminated board, comprising:
   an insulating layer containing a cured product of the resin composition according to claim 1; and
   a metal layer bonded to the insulating layer.

7. A printed wiring board, comprising:
   an insulating layer containing a cured product of the resin composition according to claim 1; and
   wiring formed on a surface of the insulating layer.

8. A metal foil with resin, comprising:
   an insulating layer containing the resin composition according to claim 1 in an uncured state; and
   a metal layer in contact with the insulating layer.

* * * * *